(12) United States Patent
Qin et al.

(10) Patent No.: US 8,951,840 B2
(45) Date of Patent: Feb. 10, 2015

(54) FCOC (FLIP CHIP ON CHIP) PACKAGE AND MANUFACTURING METHOD THEREOF

(71) Applicants: Fei Qin, Beijing (CN); Guofeng Xia, Beijing (CN); Tong An, Beijing (CN); Chengyan Liu, Beijing (CN); Wei Wu, Beijing (CN); Wenhui Zhu, Beijing (CN)

(72) Inventors: Fei Qin, Beijing (CN); Guofeng Xia, Beijing (CN); Tong An, Beijing (CN); Chengyan Liu, Beijing (CN); Wei Wu, Beijing (CN); Wenhui Zhu, Beijing (CN)

(73) Assignee: Beijing University of Technology, Beijing (CN)

( * ) Notice: Subject to any disclaimer, the term of this patent is extended or adjusted under 35 U.S.C. 154(b) by 0 days.

(21) Appl. No.: 14/354,592

(22) PCT Filed: Dec. 4, 2012

(86) PCT No.: PCT/CN2012/085818
§ 371 (c)(1),
(2) Date: Apr. 27, 2014

(87) PCT Pub. No.: WO2013/097582
PCT Pub. Date: Jul. 4, 2013

(65) Prior Publication Data
US 2014/0302640 A1    Oct. 9, 2014

(30) Foreign Application Priority Data

Dec. 30, 2011  (CN) .......................... 2011 1 0457533

(51) Int. Cl.
*H01L 21/00*  (2006.01)
*H01L 21/48*  (2006.01)
*H01L 21/56*  (2006.01)

(52) U.S. Cl.
CPC ........ *H01L 21/4828* (2013.01); *H01L 21/4825* (2013.01); *H01L 21/563* (2013.01)
USPC ........... 438/108; 438/106; 438/109; 438/110; 438/613; 257/777; 257/E25.013; 257/E21.508

(58) Field of Classification Search
CPC .......... H01L 29/00; H01L 24/00; H01L 25/00
USPC .......... 438/107, 612, 106, 108, 109, 613, 110, 438/584, 615, 618; 257/E25.013, E21.503, 257/777, 738, 778, E21.508, 781
See application file for complete search history.

(56) References Cited

U.S. PATENT DOCUMENTS 6,258,626 B1 * 7/2001 Wang et al. .................... 438/107
6,613,606 B1 * 9/2003 Lee ............................... 438/108
(Continued)

FOREIGN PATENT DOCUMENTS

CN          1387255       12/2002
CN         102222657      10/2011
(Continued)

*Primary Examiner* — Telly Green
(74) *Attorney, Agent, or Firm* — Han IP Corporation

(57) ABSTRACT

A manufacturing method for Flip Chip on Chip (FCoC) package based on multi-row Quad Flat No-lead (QFN) package is provided wherein the lower surface of plate metallic base material are half-etched to form grooves. Insulation filling material is filled in the half-etched grooves. The upper surface of plate metallic base material is half-etched to form chip pad and multi-row of leads. Encapsulating first IC chip, second IC chip, solder bumps, underfill material, and metal wire to form an array of FCoC package based on the type of multi-row QFN package. Sawing and separating the FCoC package array, and forming FCoC package unit.

4 Claims, 14 Drawing Sheets

(56) References Cited

U.S. PATENT DOCUMENTS

| | | | |
|---|---|---|---|
| 7,282,804 B2* | 10/2007 | Lee | 257/777 |
| 7,517,778 B2* | 4/2009 | Lee et al. | 438/584 |
| 7,919,873 B2* | 4/2011 | Lee et al. | 257/778 |
| 7,960,212 B2* | 6/2011 | Lee et al. | 438/110 |
| 7,960,842 B2* | 6/2011 | Lee et al. | 257/777 |
| 8,124,446 B2* | 2/2012 | Lee et al. | 438/106 |
| 2004/0023436 A1* | 2/2004 | Lee | 438/108 |
| 2004/0259288 A1 | 12/2004 | Mostafazadeh et al. | |
| 2008/0009098 A1* | 1/2008 | Lee et al. | 438/109 |
| 2008/0070345 A1* | 3/2008 | Lin et al. | 438/107 |
| 2008/0070346 A1* | 3/2008 | Lin et al. | 438/107 |
| 2009/0057901 A1* | 3/2009 | Lin et al. | 257/738 |
| 2009/0065937 A1* | 3/2009 | Lin et al. | 257/738 |
| 2009/0179333 A1* | 7/2009 | Martin et al. | 257/779 |

FOREIGN PATENT DOCUMENTS

| | | |
|---|---|---|
| CN | 102522394 | 6/2012 |
| CN | 102543937 | 7/2012 |

* cited by examiner

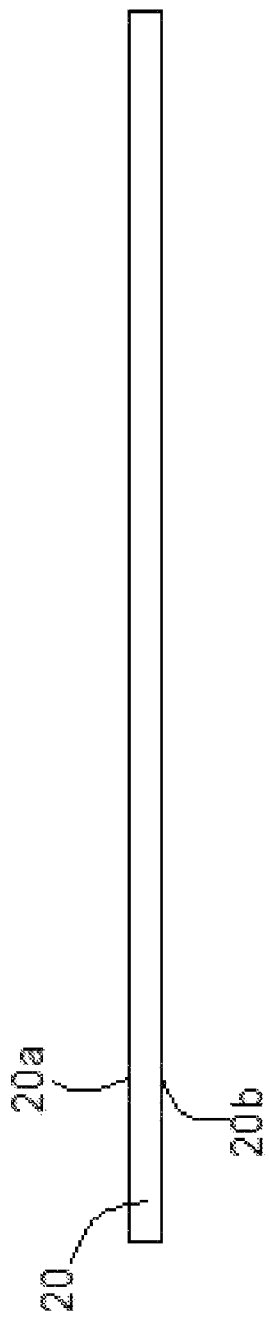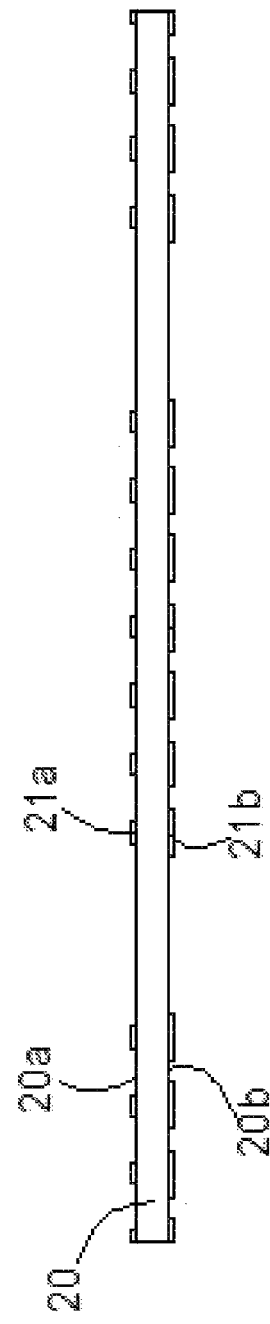

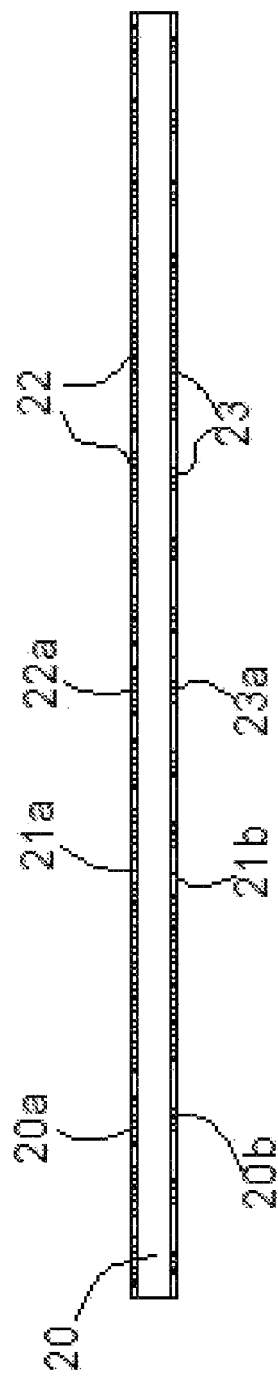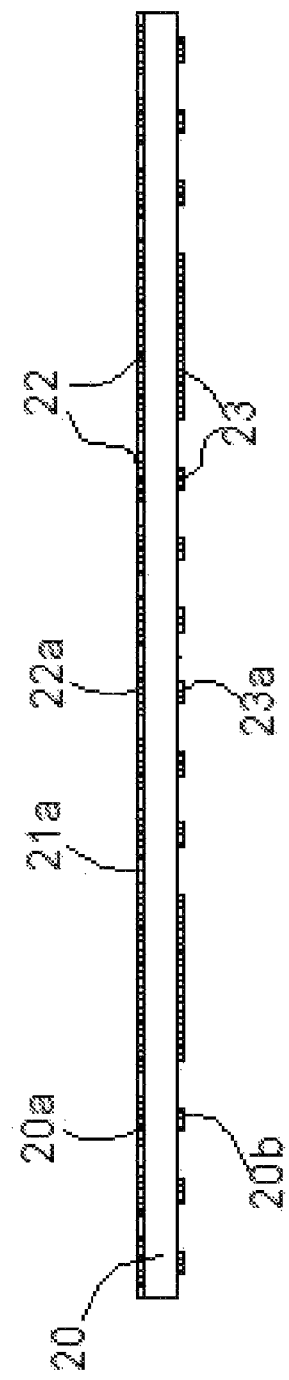

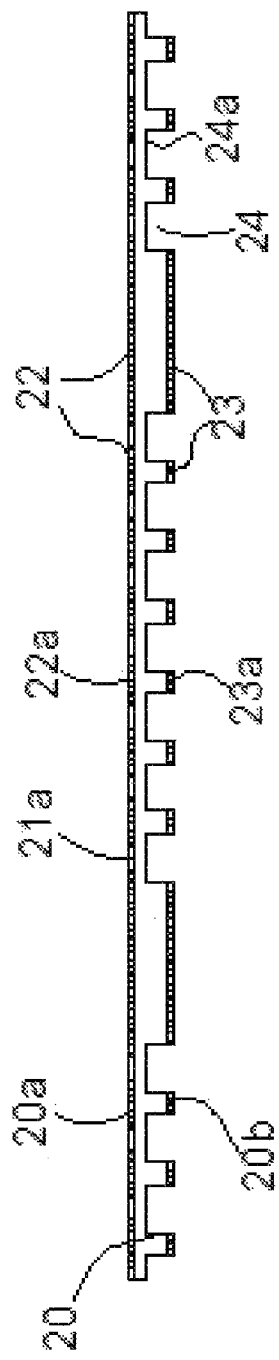
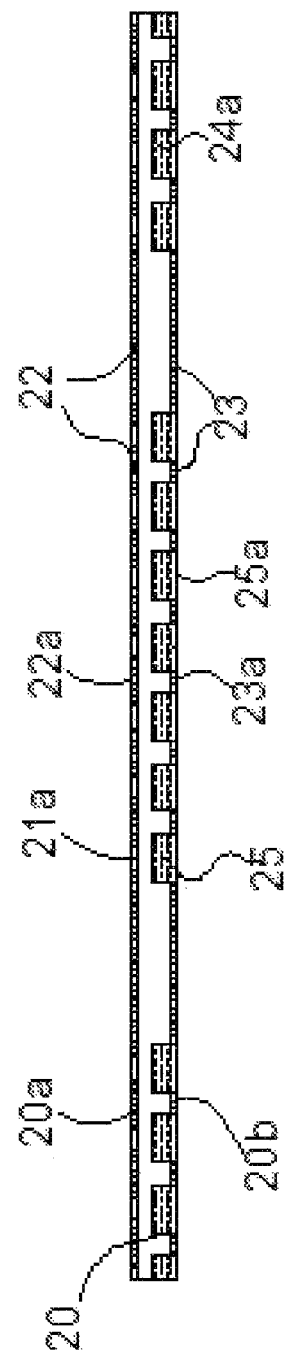
FIG. 5E
FIG. 5F

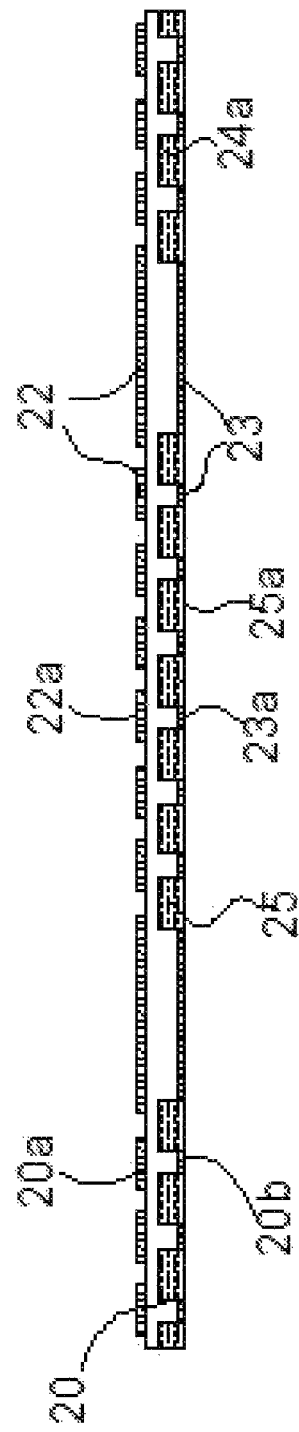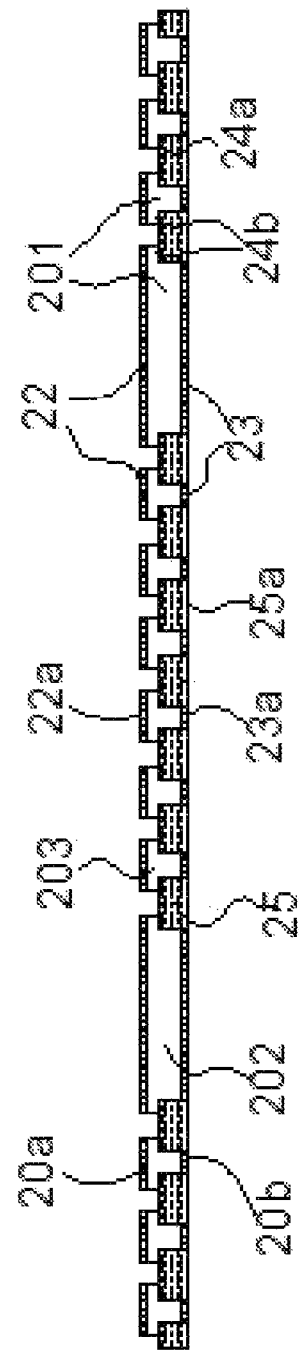

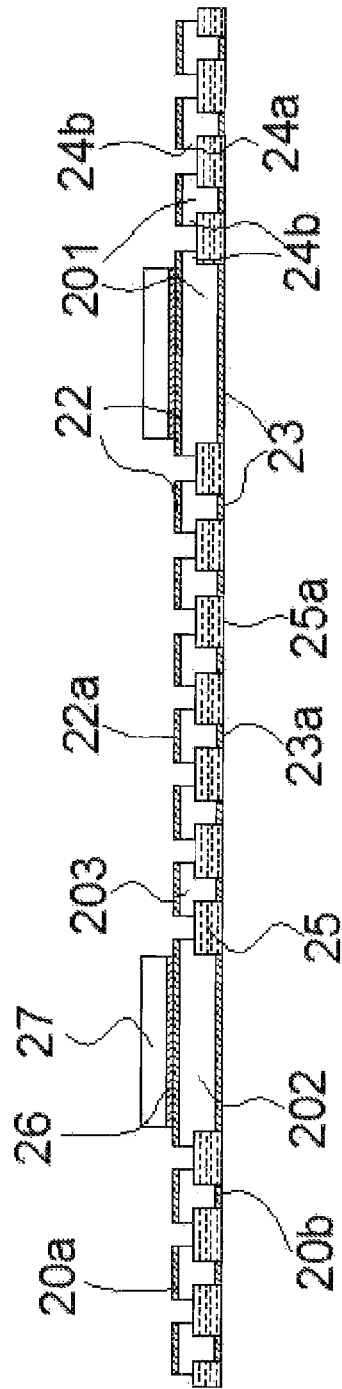
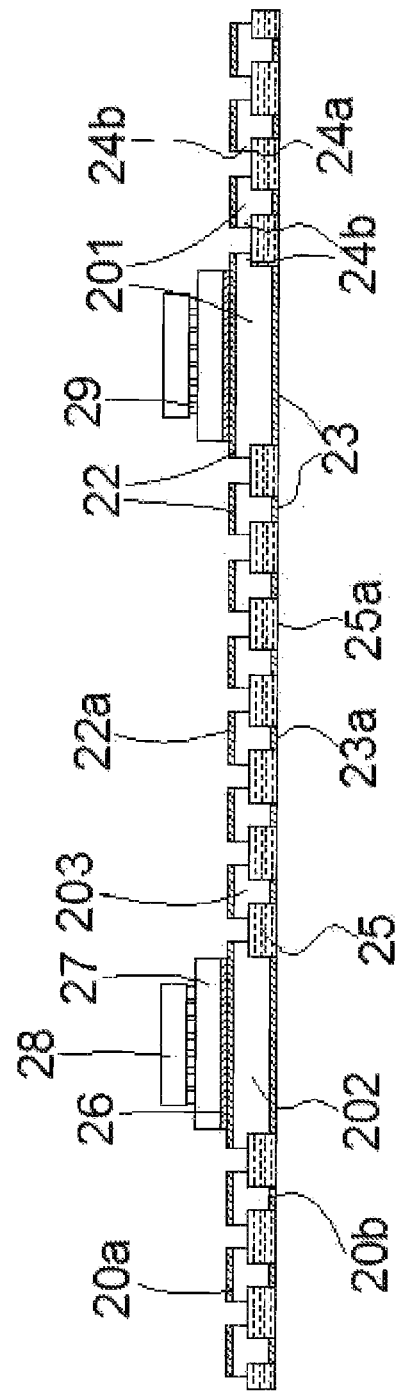
FIG. 5I
FIG. 5J

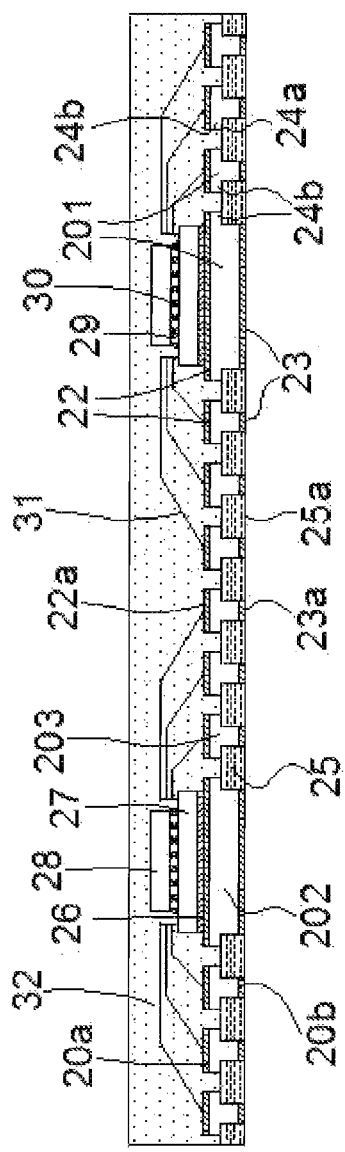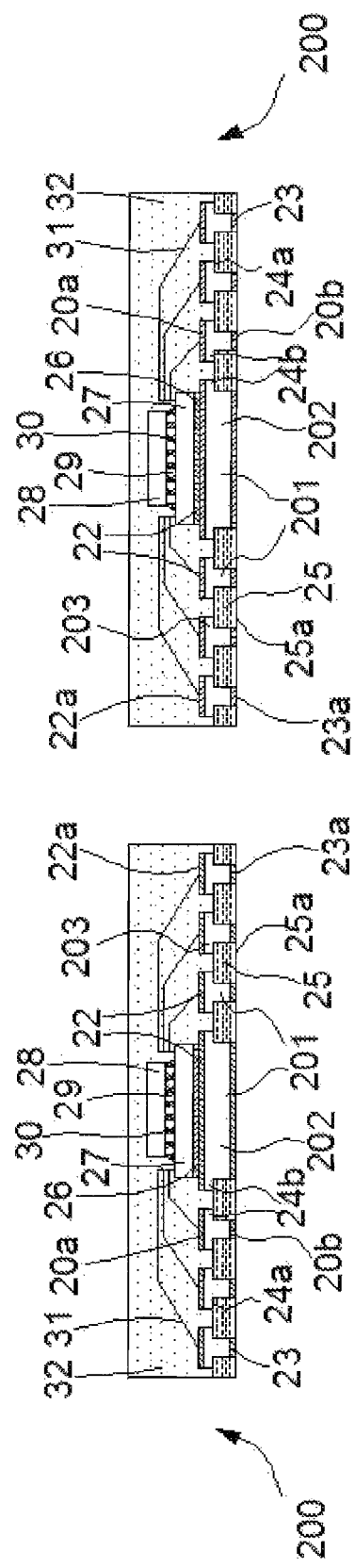
FIG. 5M
FIG. 5N

FCOC (FLIP CHIP ON CHIP) PACKAGE AND MANUFACTURING METHOD THEREOF

CROSS REFERENCE TO RELATED APPLICATION

This application is a national stage application of International application number PCT/CN2012/085818, filed Dec. 4, 2012, titled "FLIP CHIP ON CHIP PACKAGE AND MANUFACTURING METHOD," which claims the priority benefit of Chinese Patent Application No. 201110457533.9, filed on Dec. 30, 2011, which is hereby incorporated by reference in its entirety.

TECHNICAL FIELD

The present invention relates to electronic devices fabrication technology, in particular to a Flip Chip on Chip (FCoC) package based on multi-row Quad Flat No-lead (QFN) package and a manufacturing method thereof.

BACKGROUND

With the miniaturized, portable, ultra-thin, multi-media and low cost-oriented development of electronic products such as mobile phones, laptops, etc., high-density, high-performance, high-reliability and low-cost package forms and the assembly technology have been developed rapidly. Compared with expensive packages such as BGA and the like, in recent years, the novel package technology has developed rapidly (that is, QFN package (Quad Flat Non-lead Package)). As they have the advantages of good thermal and electrical performance, small size, low cost, high productivity, etc., a new revolution in the field of microelectronics packaging technology is introduced.

FIG. 1A is a bottom view of conventional QFN package. FIG. 1B shows a cross-sectional view of conventional QFN package taken along line I-I of FIG. 1A. Conventional QFN package 100 comprises lead frame 11, plastic mold material 12, adhesive layer 13, IC chip 14 and metal wires 15, wherein lead frame 11 comprises chip pad 111 and leads 112 arrayed around chip pad 111. IC chip 14 is fixed on chip pad 111 through adhesive material 13. IC chip 14 and the leads 112 arrayed around are in electrical communication through metal wires 15. Plastic mold material 12 encapsulates IC chip 14, metal wires 15 and lead frame 11 to protect and support them. Chip pad 111 and leads 112 are exposed at the lower surface of plastic mold material 12. Leads 112 are welded on a circuit board such as PCB and the like through solder to realize the electrical connection with external circuits. Chip pad 111 is welded on a circuit board such as PCB and the like through solder. As a result, there is a direct heat dissipation channel to effectively release the heat generated by IC chip 14. Compared with TSOP and SOIC packages, QFN package does not have a gull wing-shaped lead and has a short conductive path, low self-inductance coefficient and low impedance, thus providing sound electrical performance and meeting high-speed or microwave application requirement.

With the improved integration and enhanced functions of IC, the I/O number of IC is increased, and the I/O number of leads of electronic package is correspondingly increased. The package form is gradually developed from two-dimensional package form to three-dimensional package form with better integration. The conventional QFN package 100 is in the typical two-dimensional package form. Just only a single row of leads 112 are arrayed around chip pad 111, thus limiting the number of leads 112 and not meeting the requirements of IC with high density and more I/Os.

The lead frame 11 of conventional QFN package 100 is not effectively interlocked with plastic mold material 12, resulting in poor adhesion between lead frame 11 and plastic mold material 12, which may easily cause delamination failure, and even chip pad 111 and leads 112 falling off. Furthermore, moisture may not be effectively prevented from diffusing into inside along the interface between lead frame 11 and plastic mold material 12. During the molding process of conventional QFN package 100, an adhesive tape is required to be pasted on the bottom of lead frame 11 in advance to prevent overflow problem. After molding process, the adhesive tape removing, the plastic mold material flash trimming and cleaning processes are required, which thus increases the manufacturing cost. During the sawing process of conventional QFN package 100, a blade saws the metal of lead frame 11 as well as plastic mold material 12, which results in lower efficiency, short blade life, and metal burrs problem. Therefore, in order to break through the bottleneck of the low density, to improve reliability, and to reduce manufacturing cost of conventional QFN package, there is an urgent need to develop a three-dimensional package based on QFN package and a manufacturing method thereof with high reliability, low cost, and high density.

SUMMARY

The present invention is to provide a Flip Chip on Chip (FCoC) package based on multi-row QFN package and a manufacturing method thereof, in order to break through the bottleneck of the density of conventional QFN package and to improve the reliability.

In order to achieve the abovementioned objective, the invention adopts the following technical proposal:

The invention proposes a manufacturing method of a Flip Chip on Chip (FCoC) package. The FCoC package includes: a lead frame, with a step-shaped structure along the vertical direction, an upper surface, a lower surface, and a step surface; a chip pad located at the central position of lead frame and with step-shaped structure along the vertical direction at the four edges, an upper surface, a low surface, and a step surface; a plurality of leads located at the periphery of chip pad, arrayed around chip pad in the multi-row way, and with step-shaped structure along the vertical direction; a first metal material layer located on the upper surface of lead frame; a second metal material layer located on the lower surface of lead frame; a insulation underfill material located under the step-shaped structure of lead frame; a first IC chip on the first metal material layer on the upper surface of lead frame through adhesive material, and located at the central position of chip pad; a second IC chip with solder bumps flip-chip bonded and located on the active side of main IC chip; a underfill material located between the active sides of first IC chip and second IC chip to encapsulate the solder bumps and the active sides of first IC chip and second IC chip; metal wires used to connect first IC chip with the inner leads of a plurality of leads with the first metal material layer; a plastic mold material used to encapsulate the first IC chip, the second IC chip, the underfill material, metal wire, adhesive material, the first metal material layer, and lead frame.

The said manufacturing method for the FCoC package comprises the following steps.

Step 1: forming the patterned resist mask layer: washing and pre-treating plate metallic base material, and forming patterned resist mask layer on the upper and lower surfaces of plate metallic base material, respectively.

Step 2: forming first metal material layer and second metal material layer: forming first metal material layer and second metal material layer on the upper and lower surfaces of plate metallic base material.

Step 3: half-etching the lower surface of plate metallic base material: removing patterned resist mask layer on the lower surface of plate metallic base material; half-etching the areas not covered by the second metal material layer to form grooves.

Step 4: filling insulation material into the grooves formed by half-etching the lower surface of plate metallic base material.

Step 5: half-etching the upper surface of plate metallic base material: removing patterned resist mask layer on the upper surface of plate metallic base material; half-etching the areas not covered by the first metal material layer being the mask to form lead frame with step-shaped structure, including the separated chip pad and multi-row of leads.

Step 6: fixing first IC chip: fixing first IC chip at the central position of chip pad through silver particle filled epoxy resin, adhesive tape or other adhesives.

Step 7: fixing second IC chip: flip-chip bonding and fixing second IC chip with solder bumps on the active side of the first IC chip; and connecting the solder bumps with the active surface of first IC chip through reflow bonding or thermo-compression bonding.

Step 8: filling underfill material: filling underfill material between the active side of the first IC chip and the second IC chip to encapsulate solder bumps and the active sides of the first IC chip and the second IC chip; and baking and curing after filling.

Step 9: wire bonding: metal wires are used to connect first IC chip with the inner leads of a plurality of leads with the first metal material layer.

Step 10: carrying out molding process: encapsulating first IC chip, second IC chip, solder bumps, underfill material, metal wires with plastic mold material to form an array of FCoC packages based on the type of multi-row QFN package.

Step 11: curing process: carrying out curing process according to the curing condition of the selected plastic mold material.

Step 12: printing: carrying out the laser printing for the FCoC package array;

Step 13: sawing and separating process: sawing and separating the FCoC package array, forming FCoC package unit.

According to an embodiment of the invention, the first metal material layer and the second metal material layer are formed with electroplating method or chemical plating method.

According to an embodiment of the invention, the upper surface and the lower surface of plate metallic base material are half-etched by using the first metal material layer and the second metal material layer being the mask and selecting the etchant only etch plate metallic base material.

According to an embodiment of the invention, underfill material is filled in the half-etched groove with screen printing method, coating method or other methods.

According to an embodiment of the invention, the second IC chip with solder bumps is flip-chip bonded by reflow bonding or thermo-compression bonding.

According to an embodiment of the invention, underfill material is filled between the active side of first IC chip and the active side of second IC chip through capillary filling method, pressure filling method, vacuum filling method or tilt filling method.

According to an embodiment of the invention, if blade sawing method, laser sawing method or water jet sawing method is used for forming FCoC package unit, only plastic mold material and filling material, rather than lead frame, are sawed.

Base on the abovementioned, the FCoC package based on multi-row QFN package according to the present invention is a three-dimensional package and has relatively high I/O density. The solder bumps are used as the electrical connection channel between first IC chip and second IC chip, thus shortening the signal transmission path, reducing the signal delay and crosstalk, and decreasing the package height. The step-shaped structure of lead frame has the interlocking effect between lead frame and plastic mold material/filling material, and may effectively prevent the interfacial delamination as well as leads and chip pad from falling off. Moreover, the step-shaped structure of lead frame may effectively prevent moisture from diffusing from the outside of the package into the inside thereof. The first metal material layer and the second metal material layer located on the upper surface and the lower surface of lead frame may effectively improve wire bonding and surface mounting quality, respectively. When the FCoC package array is sawed into FCoC package units, only plastic mold material and underfill material are sawed, which will thus improve the sawing efficiency, prolong the life of blade, and prevent metal burrs from being generated. Meanwhile, unlike the manufacturing process of conventional QFN package, an adhesive tape is not required to be pasted on the bottom of lead frame in the manufacturing process of FCoC package in present invention, which thus reduces the manufacturing cost.

The abovementioned characteristics and advantages of the present invention are described in details with drawings and the following embodiments.

Figure 1A:
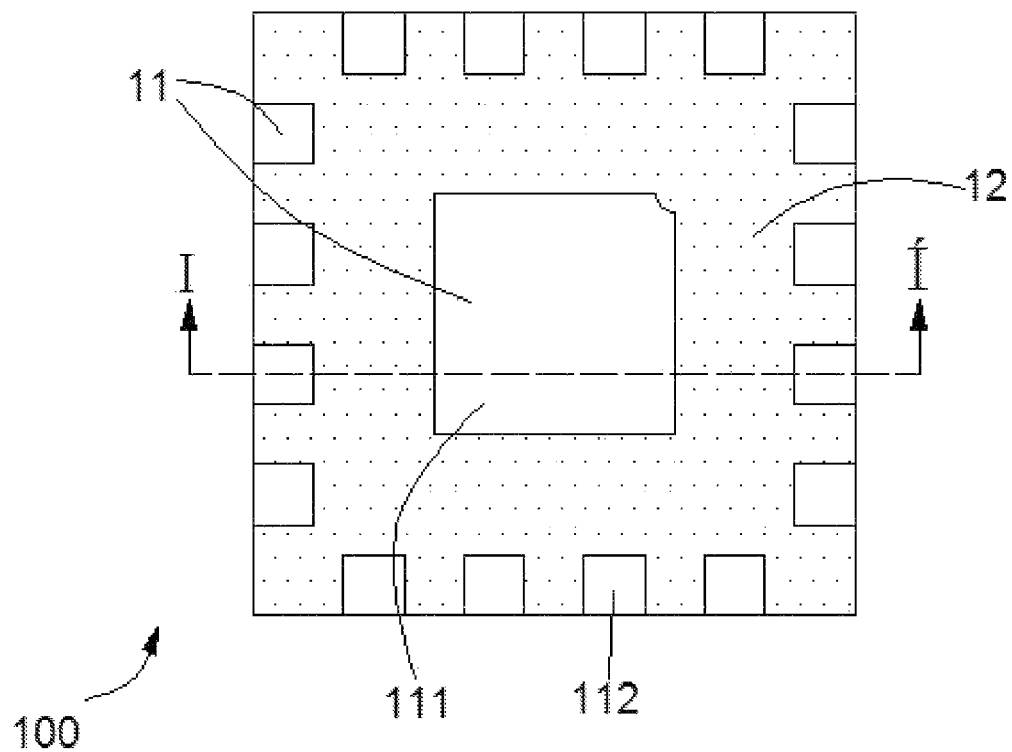
FIG. 1A is a bottom view of conventional QFN package.
Figure 1B:
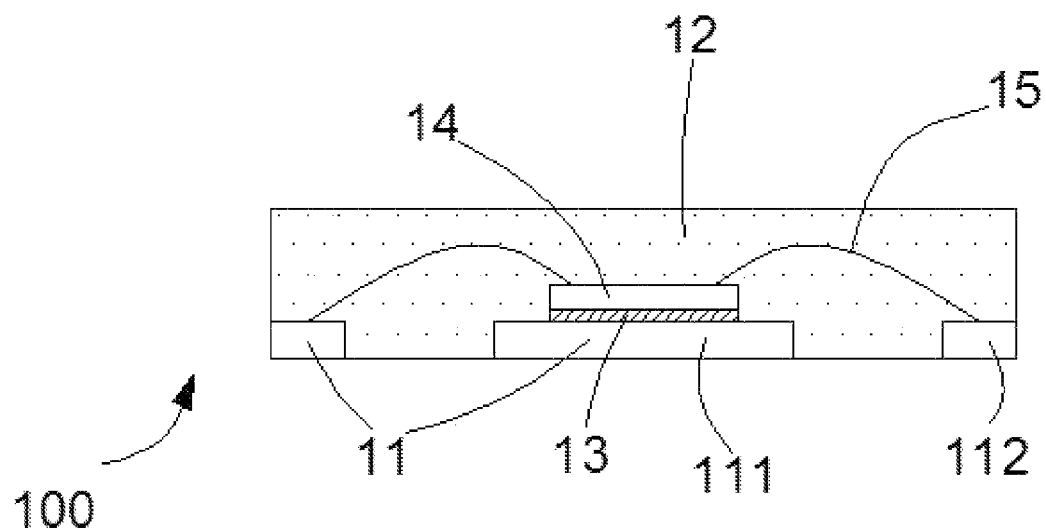
FIG. 1B is a cross-sectional view of conventional QFN package in FIG. 1A taken along line I-Í.

Reference numbers in the drawings refer to the following elements: 100: Conventional QFN Package; 11: Lead Frame; 111: Chip Pad; 112: Lead; 12: Plastic Mold material; 13: Adhesive Material; 14: IC Chip; 15: Metal Wire; 200, 200a, 200b, 200c and 200d: Flip Chip on Chip (FCoC) Package; 201: Lead Frame; 202: Chip Pad; 203: Lead; 20: Plate Metallic Base Material; 20a: Upper Surfaces of Plate Metallic Base Material and Lead Frame; 20b: Lower Surfaces of Plate Metallic Base Material and Lead frame; 21a and 21b: Patterned Resist mask layer; 22: The First Metal Material Layer; 22a: First Metal Material Layer Surface; 23: The Second Metal Material Layer; 23a: Second Metal Material Layer Surface; 24: Groove; 24a: Step-Shaped Structure Surface; 24b: Step-Shaped Structure; 25: Insulation Underfill material; 25a: Insulation Filling Material Surface; 26: Adhesive Material; 27: First IC Chip 28: Second IC Chip; 29: Solder Bumps; 30: Underfill material; 31: Metal Wire; 32: Plastic Mold material.

DETAILED DESCRIPTION OF THE PREFERRED EMBODIMENTS

The invention is further described in details in the combination with drawings.

Figure 2A:
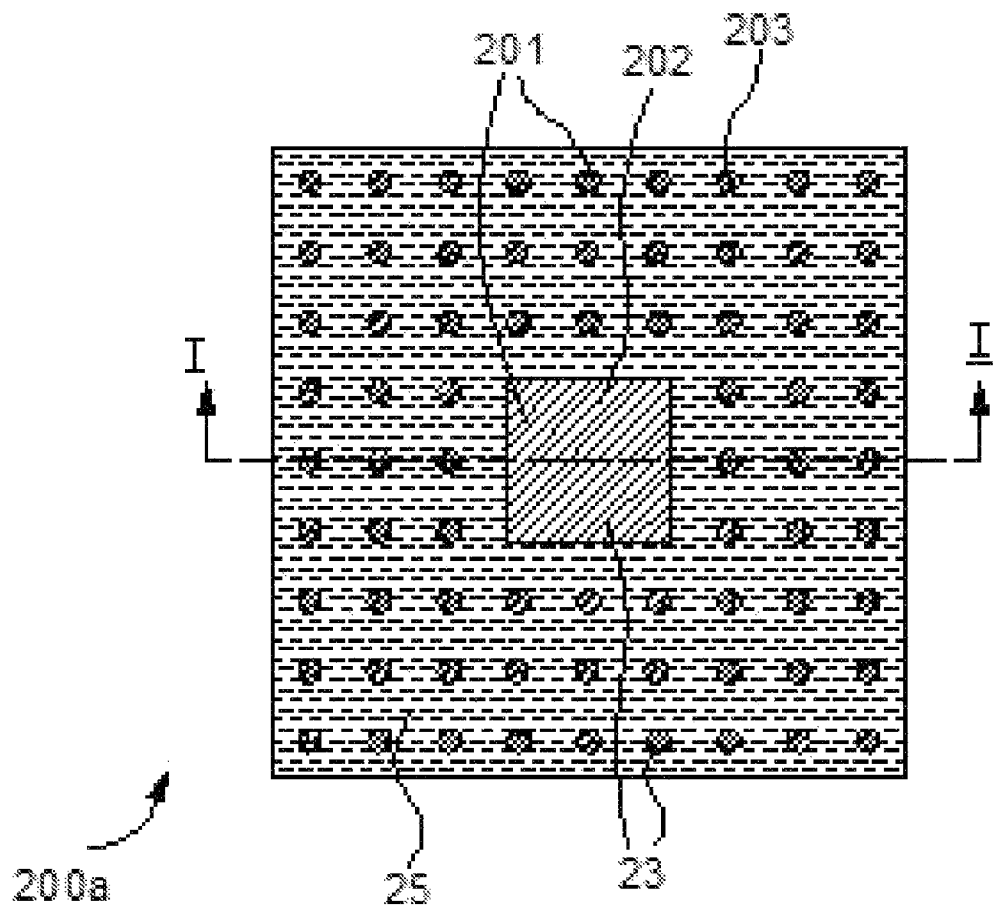
FIG. 2A is a bottom view of a Flip Chip on Chip (FCoC) package in accordance with the present invention in which the cross section of leads is round-shaped and the leads at each side of chip pad are arrayed in parallel.
Figure 2B:
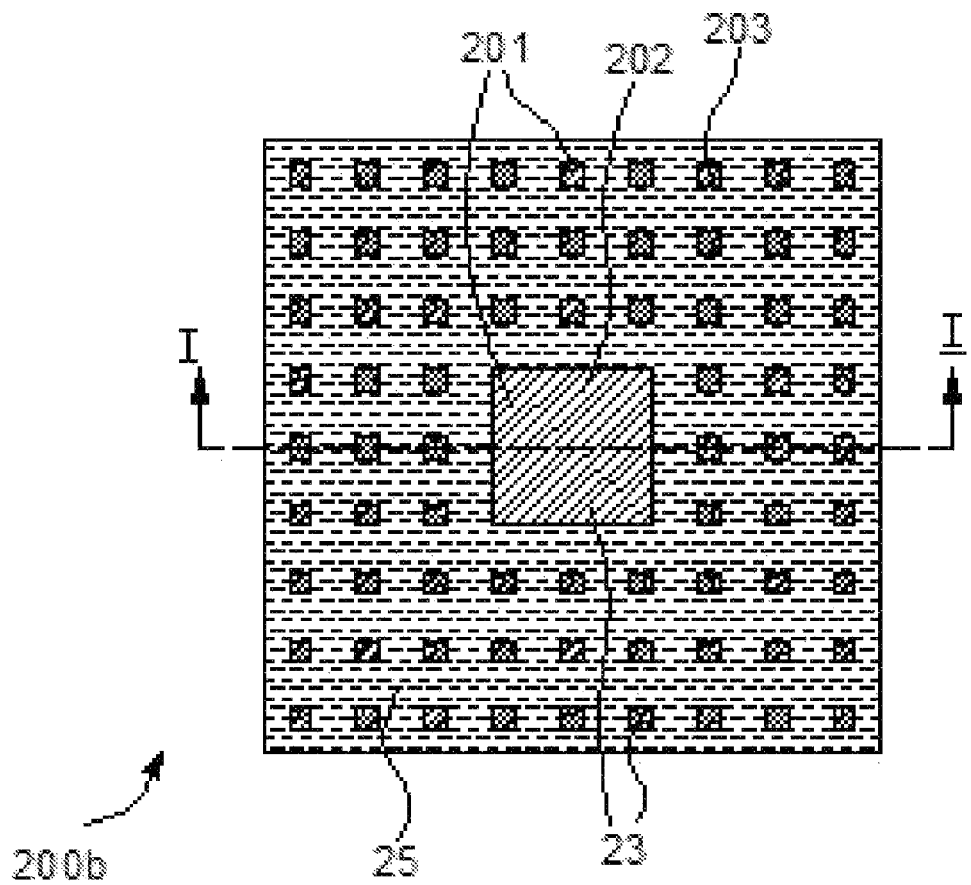
FIG. 2B is a bottom view of a Flip Chip on Chip (FCoC) package in accordance with the present invention in which the cross section of leads is rectangle-shaped and the leads at each side of chip pad are arrayed in parallel.

FIG. 2A is a bottom view of a FCoC package 200a in accordance with an embodiment of the invention in which the cross section of leads 203 is round-shaped and the leads 203 at each side of chip pad 202 are arrayed in parallel; FIG. 2B is a bottom view of a FCoC package 200b in accordance with an embodiment of the invention in which the cross section of leads 203 is rectangle-shaped and the leads at each side of chip pad 202 are arrayed in parallel.

Referred to FCoC package 200a and 200b in FIG. 2A-B, lead frame 201 comprises chip pad 202 and a plurality of leads 203. Leads 203 are arrayed around chip pad 202 in the multi-row way. Lead frame 201 is configured with the second metal material layer 23 at the lower surface thereof and with insulation filling material 25 therein. The cross section of leads 203 in FIG. 2A is round-shaped while the cross section of leads 203 in FIG. 2B is rectangle-shaped.

Figure 3A:
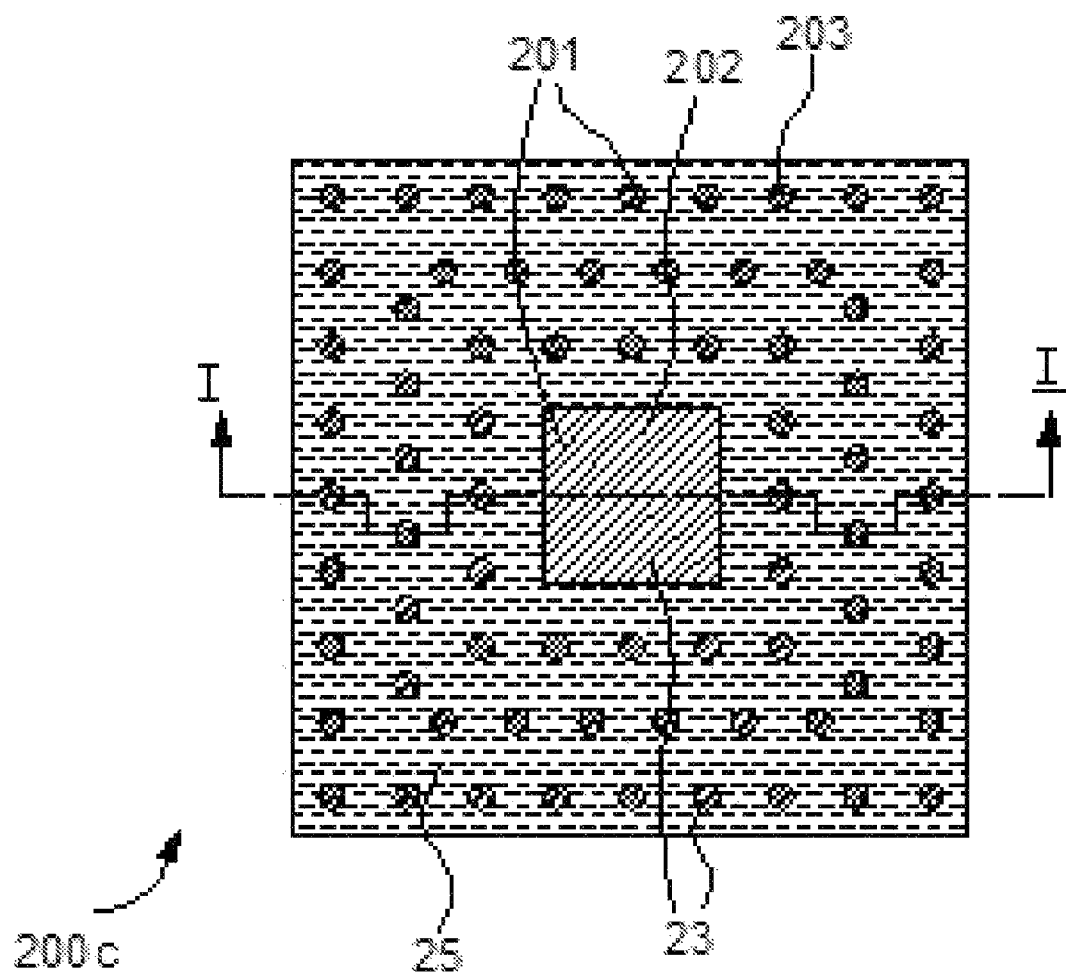
FIG. 3A is a bottom view of a Flip Chip on Chip (FCoC) package in accordance with the present invention in which the cross section of leads is round-shaped and the leads at each side of chip pad are arrayed in stagger.
Figure 3B:
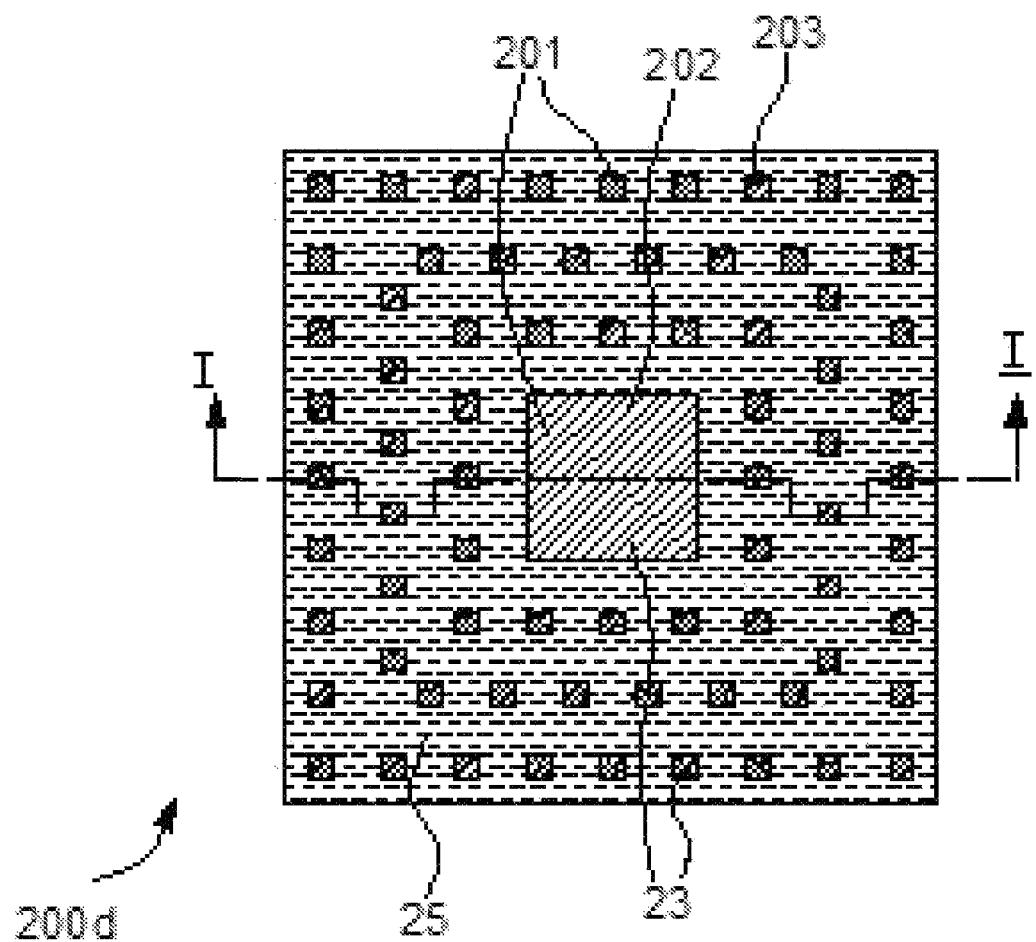
FIG. 3B is a bottom view of a Flip Chip on Chip (FCoC) package in accordance with the present invention in which the cross section of leads is rectangle-shaped and the leads at each side of chip pad are arrayed in stagger.

FIG. 3A is a bottom view of the FCoC package 200c in accordance with an embodiment of the invention in which the cross section of leads 203 is round-shaped and the leads 203 at each side of chip pad are arrayed in stagger. FIG. 3B is a bottom view of the FCoC package 200d in accordance with an embodiment of the invention in which the cross section of leads 203 is rectangle-shaped and the leads 203 at each side of chip pad 202 is arrayed in stagger.

Referred to FCoC package 200c and 200d in FIG. 3A-B, lead frame 201 comprises chip pad 202 and a plurality of leads 203. Leads 203 are arrayed around chip pad 202 in the multi-row way. Lead frame 201 is configured with the second metal material layer 23 at the lower surface thereof and with insulation filling material 25 therein. The cross section of leads 203 in FIG. 3A is round-shaped while the cross section of leads 203 in FIG. 3B is rectangle-shaped.

Figure 4:
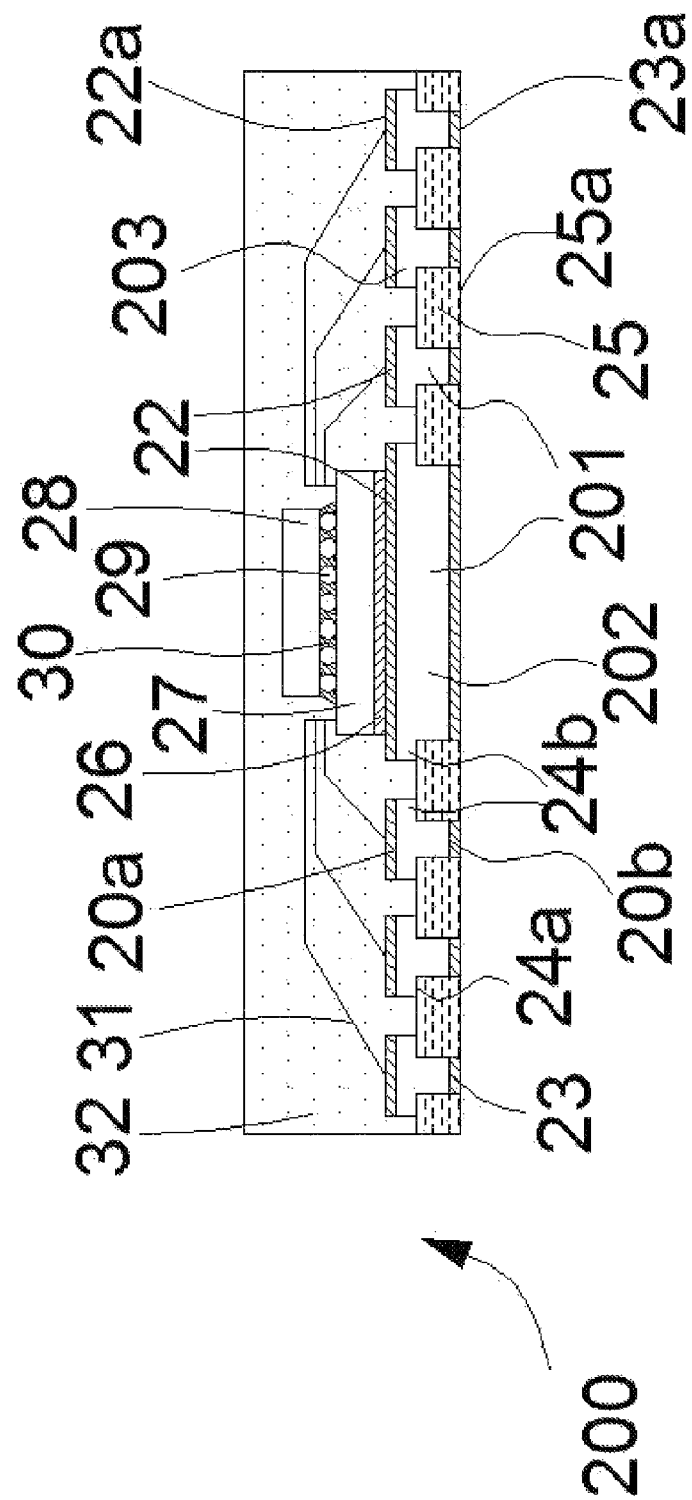
FIG. 4 is a cross-sectional view of Flip Chip on Chip (FCoC) package taken along line I-I in FIG. 2A-B and FIG. 3A-B in accordance with the present invention.

FIG. 4 is a cross-sectional view taken along line I-I in FIG. 2A-B and FIG. 3A-B in accordance with an embodiment of the invention. FCoC package 200 comprises lead frame 201, first metal material layer 22, second metal material layer 23, insulation filling material 25, adhesive material 26, first IC chip 27, second IC chip 28, solder bumps 29, underfill material 30, metal wires 31 and plastic mold material 32.

In the embodiment of FIG. 4, lead frame 201, used for electrical conduction, heat dissipation and communicating with an external circuit, has step-shaped structure 24b along the vertical direction, and has upper surface 20a, lower surface 20b opposite upper surface 20a, and step surface 24a of the step-shaped structure 24b. Lead frame 201 comprises chip pad 202 and a plurality of leads 203. Leads 203 are arrayed around chip pad 202 in the multi-row way. Chip pad 202 and leads 203 have step-shaped structure 24b. Chip pad 202 is located at the central position of lead frame 201, has a rect-angle-shaped cross section and has step-shaped structure 24b along the vertical direction at the periphery. A plurality of leads 203 are located at the periphery of chip pad 202 in the multi-row way, have step-shaped structure 24b along the vertical direction, and have a round-shaped or rectangle-shaped cross section, wherein each lead 203 comprises an inner lead configured on the upper surface 20a, and an outer lead configured on the lower surface 20b.

The first metal material layer 22 and the second metal material layer 23 are located on the upper surface 20a and the lower surface 20b of lead frame 201, respectively. The first metal material layer 22 and the inner lead of lead 203 have the same size while the second metal material layer 23 and the outer lead of lead 203 have the same size. The first metal material layer 22 has surface 22a while the second metal material layer 23 has surface 23a.

Insulation filling material 25 is located under the step-shaped structure 24 of lead frame 201 to support and protect lead frame 201. Insulation filling material 25 has surface 25a, which is at the same plane with the second metal material layer surface 23a.

First IC chip 27 is located on the first metal material layer 22 of the upper surface 20a of lead frame 201 through adhesive material 26 and fixed at the central position of chip pad 202. Second IC chip 28 with solder bumps 29 is located on the active side of first IC chip 27 by using a flip-chip die bonder machine. Underfill Material 30 is located between the active side of first IC chip 27 and the active side of second IC chip 28 to encapsulate solder bump 29, the active side of first IC chip 27, and the active side of second IC chip 28. The plastic mold material 32 encapsulates first IC chip 27, second IC chip 28, bump 29, underfill 30, metal wires 31, lead frame 201 and the first metal material layer 22 to form an array of FCoC packages based on the type of multi-row QFN package.

With the following FIG. 5A-N, the manufacturing process of FCoC package is described in details.

Referred to FIG. 5A, the invention provides a plate metallic base material 20 with the upper surface 20a and the lower surface 20b opposite the upper surface 20a. Plate metallic base material 20 can be copper, copper alloy, iron, iron alloy, nickel, nickel alloy and other metal materials adapted for manufacturing lead frame. The thickness of plate metallic base material 20 is preferably in the range of 0.1 mm to 0.25 mm, such as 0.127 mm, 0.152 mm and 0.203 mm. The upper surface 20a and the lower surface 20b of plate metallic base material 20 are cleaned and pre-treated.

Referred to FIG. 5B, patterned resist mask layers 21a and 21b are respectively formed with windows on the upper surface 20a and the lower surface 20b of plate metallic base material 20. The windows are uncovered areas on the upper surface 20a and the lower surface 20b of plate metallic base material 20 by the pattered resist mask layers. Patterned resist mask layers 21a and 21b protect plate metallic base material 20 covered with them. In the following manufacturing processes, plate metallic base material 20 uncovered with patterned resist mask layers 21a and 21b are etched. Patterned resist mask layers 21a and 21b are required to be firmly boned onto plate metallic base material 20 and have the ability of thermal stability, etching resistance and plating resistance. The methods of forming patterned resist mask layers 21a and 21b may be screen printing method and a photosensitive imaging method. As to screen printing method, the materials of patterned resist mask layers 21a and 21b are non-photo-sensitive resin, printing ink or other polymers, and are directly formed with screen printing process. As to photosensitive imaging method, a photoinduced wet film or a photoinduced dry film is coated on the upper surface 20a and the lower surface 20b of plate metallic base material 20, respectively; then selective exposure and development processes are carried out in sequence to form patterned resist mask layers 21a and 21b.

Referred to FIG. 5C, the first metal material layer 22 is formed on the window areas of the upper surface 20a of plate metallic base material. The first metal material layer 22 has surface 22a. The second metal material layer 23 is formed on the window areas of the lower surface 20b of plate metallic base material 20. The second metal material layer 23 has surface 23a. The first metal material layer 22 and the second metal material layer 23 are formed by using electroplating method, chemical plating method, evaporation method, sputtering method and other methods. In the embodiment, electroplating method and chemical plating method are preferred. The first metal material layer 22 and the second metal material layer 23 may be Ni, Pd, Au, Ag and Sn and corresponding alloys. In the embodiment, the first metal material layer 22 and the second metal material layer 23 are Ni—Pd—Au plating layer. As to the first metal material layer 22, an external Au plating layer and an middle Pd plating layer guarantee wire bonding quality of metal wire 28 and flip-chip bonding quality of solder bumps 31 while the inner Ni plating layer is taken as a diffusion resist mask layer to prevent the over-growth of intermetallic compound caused by diffusion-chemical reaction from being generated. The over-growth of intermetallic compound affects the reliability of bonding joints. As to the second metal material layer 23, the external Au plating layer and the middle Pd plating layer guarantee the wettability of the solder on lead frame 201 and improve the surface mounting quality of the package on PCB board while the inner Ni plating layer is taken as the diffusion resist mask layer to prevent the over-growth of intermetallic compound caused by diffusion-chemical reaction from being generated. The over-growth of intermetallic compound affects the reliability of bonding solder joints.

Referred to FIG. 5D, patterned resist mask layer 21b on the lower surface 20b of plate metallic base material 20 is removed. The removing method in the embodiment may be chemical reaction method and mechanical method. As to chemical reaction method, a soluble alkaline solution, such as KOH, NaOH and the like, is selected. The soluble alkaline solution is sprayed and reacted chemically with patterned resist mask layer 21b to dissolve it. The organic solution may be also selected to remove patterned resist mask layer 21b. After patterned resist mask layer 21b is removed, only the second metal material layer 23 is left on the lower surface 20b of plate metallic base material 20.

Referred to FIG. 5E, the second metal material layer 23 on the lower surface 20b of plate metallic base material 20 is taken as an etching resist mask layer. An etchant only etching plate metallic base material 20 is selected. The lower surface 20b of plate metallic base material 20 is half-etched by using praying method to form grooves 24 and step-shaped structure surface 24a. The etching depth range may be within 40%-90% of the thickness of plate metallic base material 20. In the embodiment, an upper spraying method is preferred. Furthermore, a small amount of organic substance may be added into the etchant to reduce side-etch effect of the etchant on plate metallic base material 20. As the second metal material layer 23 is adopted as the etching resist mask layer, the etchant is preferably an alkaline etchant, such as alkaline copper chloride etchant, ammonium chloride etchant and the like, to reduce the damaging effects of the etchant on the second metal material layer 23.

Referred to FIG. 5F, grooves 24 are filled with insulation filling material 25. Insulation filling material 25 has the surface 25a at the same plane with the second metal material surface 23a. In the embodiment, insulation filling material 25 may be thermosetting plastic material, plug-hole resin, and solder mask. Insulation filling material 25 has the ability of acid resistance and alkali resistance to guarantee that the sequent manufacturing processes do not damage it. Insulation filling material 25 is filled in grooves 24 with injection molding method or screen printing method. Curing process is carried out after filling to obtain proper hardness. The excessive insulation filling material 25 is removed with mechanical grinding method or chemical processing method. The surface 25a of insulation filling material 25 and the second metal material layer surface 23a are at the same plane.

Referred to FIG. 5G, patterned resist mask layer 21a on the upper surface 20a of plate metallic base material 20 is removed. The removing method in the embodiment may be chemical reaction method and mechanical method. As to chemical reaction method, a soluble alkaline solution, such as KOH, NaOH and the like, is selected. The soluble alkaline solution is sprayed and reacted chemically with patterned resist mask layer 21a to dissolved it. The organic solution is also selected to remove patterned resist mask layer 21a. After patterned resist mask layer 21a is removed, only the first metal material layer 22 is left on the upper surface 20a of plate metallic base material 20.

Referred to FIG. 5H, the first metal material layer 22 on the upper surface 20a of plate metallic base material 20 is taken as etch resist mask layer. An etchant only etching plate metallic base material 20 is selected to carry out half-etching process. Step-shaped structure surface 24a is formed by using spraying method. Lead frame 201 is formed when insulation filling material 25 is exposed during half-etching process. Lead frame 201 comprises chip pad 202 and the leads 203 arrayed around chip pad 202 in the multi-row way. Chip pad 202 and leads 203 are bonded together through insulation filling material 25. Step-shaped structure 24b has step-shaped structure surface 24a. In the embodiment, upper spraying method is preferred. A small amount of organic substance is added into the etchant, so as to reduce the side-etch effect of the etchant on plate metallic base material 20. As the first metal material layer 22 is adopted as the etching resist mask layer, the etchant is preferably alkaline etchant, such as alkaline copper chloride etchant, ammonium chloride etchant and so on, to reduce the damaging effects of the etchant on the first metal material layer 22.

Referred to FIG. 5I, by using adhesive material 26, first IC chip 27 is bonded at the first metal material layer 22 of the upper surface 20a of lead frame 201 and located at the central position of chip pad 202. In the embodiment, adhesive material 26 may be adhesive tape, silver particle filled epoxy resin and other high thermal conductivity materials. After first IC chip 27 is bonded, adhesive material 26 is needed to be baked and cured, so as to enhance the adhesion strength between first IC chip 27 and the first metal material layer 22.

Referred to FIG. 5J, second IC chip 28 with solder bumps 29 is bonded on the active side of first IC chip 27 by using a flip-chip die bonder machine. Solder bumps 29 are bonded onto the active side of first IC chip 27 through reflow bonding or thermo-compression bonding method to realize the electrical interconnection between first IC chip 27 and second IC chip 28. In the embodiment, solder bumps 29 may be Lead-based solder, Lead-free solder and other metal materials.

Figure 5K:
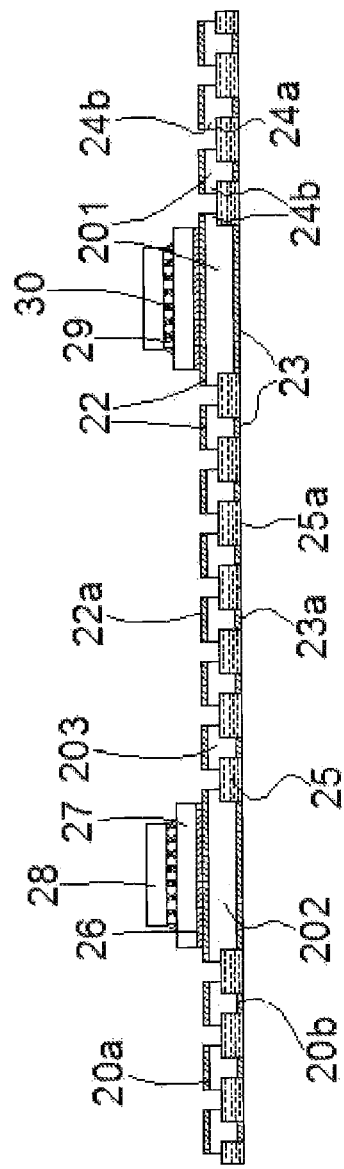
FIG. 5A-N shows an embodiment of manufacturing process steps of Flip Chip on Chip (FCoC) package in accordance with the present invention, wherein the cross-sectional views are all taken along line I-I as shown in FIG. 4.

Referred to FIG. 5K, underfill material 30 is located between the active sides of first IC chip 27 and second IC chip 28 to encapsulate solder bumps 29, the active sides of first IC chip 27 and second IC chip 28. In the embodiment, the method for filling underfill material 30 is capillary filling method, pressure filling method, vacuum filling method or tilt filling method. Underfill material 30 is baked and cured after filling process.

Figure 5L:
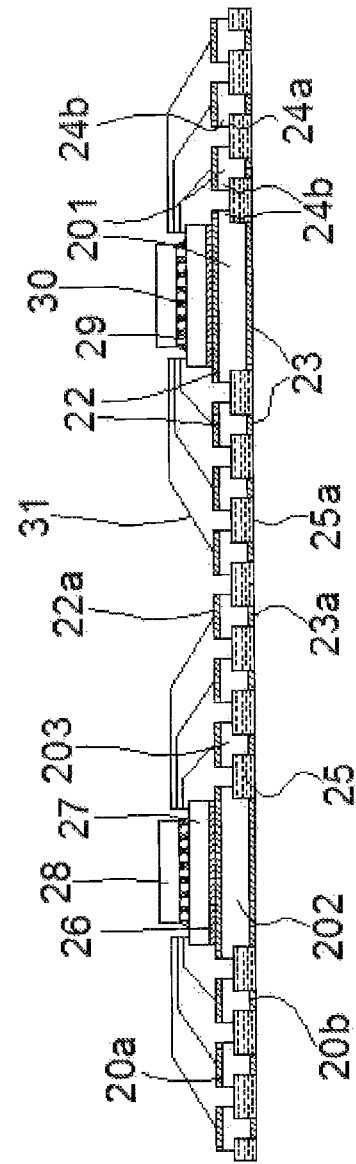

Referred to FIG. 5L, First IC chip 27 is connected to the inner leads of a plurality of leads 203 configured with the first metal material layer 22 by using metal wires 31, so as to realize the electrical interconnection. In the embodiment, metal wires 31 may be gold wire, aluminum wire, copper wire, palladium-plated copper wire, etc.

Referred to FIG. 5M, with injection molding method, environment-friendly plastic mold material 32 with low water absorption rate and low stress encapsulates first IC chip 27, second IC chip 28, solder bumps 29, underfill material 30, and metal wires 31 to form an array of Flip Chip on Chip (FCoC) package based on the type of multi-row QFN package. In the embodiment, plastic mold material 32 may be thermosetting polymer and other materials. Insulation filling material 25 has the same material properties as plastic mold material 29, for example, the coefficient of thermal expansion, so as to reduce product failure caused by thermal mismatch and improve the reliability of the product. Insulation filling material 25 and plastic mold material 32 may be the same material. Curing process is carried out after molding process to obtain proper hardness. Step-shaped structure 24b of lead frame 201 have the interlocking effect, which may effectively prevent the interfacial delamination between lead frame 201, plastic mold material 32 and insulation filling material 25, may prevent leads 203 and chip pad 202 from falling off, and may effectively prevent moisture from diffusing into inside along the combination interface. After curing process, laser printing process is carried out for FCoC package array.

Referred to FIG. 5N, FCoC package array is sawed. Plastic mold material 32 and insulation filling material 25 are sawed and separated to form FCoC package unit 200. In the embodiment, blade sawing method, laser sawing method or water jet sawing method may be used for sawing process. Only plastic mold material 32 and insulation filling material 25, rather than the metal material of lead frame, are sawed.

The objective of the description of the examples of the invention is to effectively describe the invention but not to limit. The ordinary people skilled in the prior art shall understand that the abovementioned examples may be varied without departing from the conception and scope of the invention. Therefore, the invention is not limited to the disclosed examples but covers the modifications within the essence and scope of the invention defined by the claims.

What is claimed is:

1. A method for manufacturing a Flip Chip on Chip (FCoC) package, the method comprising:
    forming patterned resist mask layers on a upper surface and a lower surface of plate metallic base material, respectively;
    forming a first metal material layer and a second metal material layer on the upper surface and the low surface of a plate metallic base material, respectively;
    removing a patterned resist mask layer on the lower surface of the plate metallic base material;
    etching a portion of the lower surface of the plate metallic base material to form grooves;
    filling insulation material into the grooves;
    removing the patterned resist mask layer on the upper surface of the plate metallic base material;
    etching a portion of the upper surface of the plate metallic base material to form a lead frame having step-shaped structure, the lead frame comprising a separated chip pad and multi-row of leads;
    fixing a first IC chip on the first metal material layer of the lead frame through adhesive material at a central position of a chip pad;
    bonding a second IC chip with solder bumps on an active side of the first IC chip through a flip-chip die bonder machine;
    connecting the solder bumps with the active side of the first IC chip through reflow bonding or thermo-compression bonding;
    fill underfill material between the active side of the first IC chip and the active side of the second IC chip to encapsulate the solder bumps and the active sides of the first IC chip and the second IC chip; and baking and curing after the filling process;
    connecting, suing metal wires, the first IC chip for wire bonding with the inner leads of a plurality of leads with the first metal material layer;
    encapsulating the first IC chip, the second IC chip with solder bumps, the material, the metal wires, the adhesive material, the first metal material layer and the lead frame with plastic mold material to form an array of FCoC package; and
    sawing and separating the FCoC package array to form a FCoC package unit, wherein:
        the FCoC pageage comprises the lead frame comprising a chip pad, a plurality of leads, and, along a vertical direction, the step-shaped structure comprising the upper surface, the low surface and a step surface;
        a chip pad is located at the central position of the lead frame and comprises the step-shaped structure along the vertical direction at the four edges, and;
        a plurality of leads are located at a periphery of the chip pad, are arrayed around chip pad in the multi-row way, and comprise the step-shaped structure along the vertical direction, the upper surface, the low surface and the step-shaped surface, each lead comprising an inner lead configured on the upper surface thereof and an outer lead configured on the low surface thereof;
        the first metal material layer is located on the upper surface of the lead frame;
        the second metal material layer is located on the low surface of the lead frame;
        the insulation material is located under the step-shaped structure of the lead frame;
        the first IC chip is fixed on the first metal material layer of the lead frame through an adhesive material, and is located at the central position of the chip pad;
        the second IC chip with solder bumps is flip-chip bonded on the active side of first IC chip;
        the underfill material is filled between the active side of the first IC chip and the active side of the second IC chip to encapsulate the solder bumps and the active sides of the first IC chip and the second IC chip;
        the metal wires are used to connect the first IC chip with the inner leads of the plurality of leads with the first metal material layer;
        the plastic mold material encapsulates the first IC chip, the second IC chip with the solder bumps, the material, the metal wires, the adhesive material, the first metal material layer and the lead frame.

2. The method for manufacturing the FCoC package of claim 1, wherein the insulation filling material connects and fixes an etching-formed separate chip pad and the multi-row leads.

3. The method for manufacturing the FCoC package of claim 1, wherein the underfill material is filled between the active side of the first IC chip and the active side of the second IC chip through a capillary filling method, a pressure filling method, a vacuum filling method or a tilt filling method.

4. The method for manufacturing the FCoC package of claim 1, wherein the FCoC package is sawed and formed with a blade sawing method, a laser sawing method or a water jet sawing method, and wherein the plastic mold material and the insulation material of the FCoC package are sawed.

* * * * *